United States Patent [19]
Yamada et al.

[11] Patent Number: 5,726,505
[45] Date of Patent: Mar. 10, 1998

[54] DEVICE TO PREVENT REVERSE CURRENT FLOW, RECTIFIER DEVICE AND SOLAR GENERATOR SYSTEM

[75] Inventors: Takaaki Yamada; Ikuo Nanno, both of Kyoto-fu, Japan

[73] Assignee: Omron Corporation, Kyoto, Japan

[21] Appl. No.: 587,905

[22] Filed: Jan. 16, 1996

[30] Foreign Application Priority Data

Jan. 13, 1995 [JP] Japan .................................. 7-020996

[51] Int. Cl.[6] .................................................. H02H 3/18
[52] U.S. Cl. .......................... 307/127; 307/51; 307/116; 361/82; 361/84
[58] Field of Search .................................. 307/127, 116, 307/51; 361/82, 84; 324/117 H; 323/277; 320/49

[56] References Cited

U.S. PATENT DOCUMENTS

| | | | |
|---|---|---|---|
| 4,596,950 | 6/1986 | Lienhard et al. | 324/117 |
| 4,617,473 | 10/1986 | Bingham | 307/66 |
| 4,661,758 | 4/1987 | Whittaker | 320/21 |
| 5,010,291 | 4/1991 | Edwards | 323/222 |
| 5,451,881 | 9/1995 | Finger | 324/433 |
| 5,483,173 | 1/1996 | Pellegrini | 324/765 |
| 5,519,557 | 5/1996 | Kopera et al. | 361/84 |

*Primary Examiner*—Richard T. Elms
*Assistant Examiner*—Albert W. Paladini
*Attorney, Agent, or Firm*—Morrison & Foerster LLP

[57] ABSTRACT

A device to prevent reverse current flow includes a diode connected between a power supply and a load. A switching device, connected in parallel with the diode, has a power loss that is smaller than that of the diode. A low-loss current detector, arranged to turn the switching device on and off, includes a DC current detector and a comparator. The comparator compares the detected DC current value with a threshold value for an operating current and generates an output signal that determines when the switching device should be turned on or off.

17 Claims, 9 Drawing Sheets

1. SOLAR CELL
2. BATTERY
3. DEVICE TO PREVENT REVERSE CURRENT FLOW
4. DIODE TO PREVENT REVERSE CURRENT FLOW

DEVICE TO PREVENT REVERSE CURRENT FLOW, RECTIFIER DEVICE AND SOLAR GENERATOR SYSTEM

FIELD OF THE INVENTION

This invention concerns a device to prevent reverse current flow, a rectifier which can make advantageous use of such a device, and a solar generator system. The device to prevent reverse current flow would be efficacious in a solar generator system using a solar cell as a power supply and supplying the power generated thereby to a battery. Another possible application would be in vehicles such as RVs or electric cars which use multiple battery systems, in which power is supplied from a single power supply to a number of batteries. To prevent the current from reversing itself and flowing back into the solar cell or other battery when the output voltage from the power supply drops, diodes are connected in series between the power supply and the load (i.e., the battery).

BACKGROUND OF THE INVENTION

As an example of a system in which a diode is used as described above to prevent reverse current flow, let us consider the solar generator system pictured in FIG. 21. During the day there is a great deal of sunlight, so the output voltage of solar cell 50, which is the power supply, is high. When the forward current $I_s$ flows to load 51, it passes through diode 52. A voltage drop of approximately 1 V results in a power loss and a decrease in generating efficiency.

To address this problem, a power supply was previously developed (see Patent Report 2-168819) which kept power loss to a minimum when current was flowing forward. If we replaced this power supply with a solar generator system, the resulting device would be configured as shown in the rough sketch in FIG. 17.

In FIG. 22, relay contacts 53 are connected in parallel to diode 52, which is interposed in series between solar cell 50 and load 51 in order to prevent reverse current flow. Normally, that is, when the output voltage of solar cell 50 is high, diode 52 is bypassed and power is supplied to load 51 through relay contacts 53, which are closed. When the output voltage of the solar cell 50 falls below a given value, the relay contacts 53 are opened by voltage detector circuit 54, and reverse current is prevented from flowing into solar cell 50.

The device to prevent reverse current flow configured as above works by detecting a drop in the output voltage of solar cell 50 or another power supply and opening relay contacts 53 in response. However, even though the output voltage of the power supply remains above a given value, if it drops below the terminal voltage of the battery, a reverse current will be generated which flows from the battery toward the power supply. This type of reverse current will not be detected by the voltage detector circuit 54.

With the existing device to prevent reverse current flow, then, diode 52 cannot always fulfill its essential function, preventing the flow of reverse current. This results in a power loss.

SUMMARY OF THE INVENTION

An objective of this invention is to provide a device with an enhanced ability to prevent reverse current flow, and which would reduce power loss when current was flowing forward.

Another objective of this invention is to provide a rectifier which would enhance the effect produced by the device to prevent reverse current flow, namely, that of reducing the power loss. This rectifier would be able to provide the specified rectification with a small voltage loss.

Yet another objective of this invention is to provide a solar generator system which would enhance the effect produced by the device to prevent reverse current flow, namely, that of reducing the power loss, improving the generating efficiency, and allowing the entire system to be reduced in size.

To achieve the objective stated above, a device to prevent reverse current flow is designed in such a way that it has a diode to prevent reverse current flow connected between the power supply and the load; a switching device, connected in parallel with the diode, whose power loss, when on, is smaller than that of the diode; a low-loss current detector which turns the switching device on and off, consisting of a DC current detector; and a comparator which compares the DC value which is detected with a threshold value for operating current. The output signal from the comparator determines when the switching device will be turned on and off.

For the switching device, a power MOSFET or voltage-sensitive relay may be used, for the diode to prevent reverse current flow, the parasitic diode of a power MOSFET may be used. The power MOSFET may be either the P-channel type or the N-channel type.

The DC current detector can be a device which detects the voltage at both terminals of either an element which passes forward current or a switching element which opens and closes in response to the output signal of an overvoltage detector circuit. This DC current detector may employ an input sensing resistor, a Hall element, or a magnetoresistance element.

The device to prevent reverse current flow, is connected, by way of a diode, to prevent reverse current flow to a power supply and to a battery which can store and discharge the power generated and supplied by this power supply. This device to prevent reverse current flow is distinguished by the following: a switching device whose power loss, when on, is smaller than that of the diode and is connected in parallel to that diode; a low-loss current detector, which turns the switching device on and off, is connected in series to the diode, connected in parallel to the switching device; and relay contacts, which cut off the supply of power to the battery when the voltage at the battery terminal exceeds a given value, is connected in series to the diode to prevent reverse current flow and in parallel to the switching device.

A device to prevent reverse current flow in a car battery is distinguished by the fact that it employs one of the devices to prevent reverse current flow in lieu of a diode to prevent reverse current flow in the system which supplies power from a single power supply to a number of batteries in an automobile, in at least the portion of that system which supplies power to the engine battery.

In order to achieve another of the objectives stated above, the rectifier is designed so as to employ one of the devices to prevent reverse current flow in lieu of the rectifier diodes constituting a rectifier circuit interposed between the power supply and the load to which the power generated thereby is supplied.

To achieve another of the objectives stated above, the solar generator system is designed so that one of the devices to prevent reverse current flow is placed between the solar cell and the solar inverter.

In the solar generator system, the solar cell and the solar inverter should be connected via a junction box containing a terminal block or connectors. The devices to prevent reverse current flow are mounted on a single board and circuit breakers.

In the solar generator system, one of the devices to prevent reverse current flow should be employed in lieu of a protective diode in the solar inverter.

When the output voltage of a power supply is above a given value the current flows forward from the power supply to the load. During this time the current flowing to the load passes to the diode which prevents reverse flow through a switching device, such as a power MOSFET or the contacts of a voltage-sensitive relay, which is connected in parallel to the diode and has a much smaller power loss than does the diode. With this scheme, the power loss due to voltage drop is substantially smaller than it would be if the current were allowed to flow unconditionally through the diode. When the output voltage of the power supply drops below the given value, or when the load is a battery and the terminal voltage at that battery exceeds the output voltage of the power supply, a reverse current will begin to flow from the battery to the power supply. When this happens, the switching device will open based on the current detected by the low-loss current detector, which may be a shunt resistor, a Hall element or a magnetoresistive element. The diode then intercepts the backward-flowing current, and reverse current flow is effectively prevented. The resistance loss of the device to prevent reverse current flow is also extremely small, so the power loss when the terminal voltage at the battery exceeds the output voltage of the aforesaid power supply is very small as well.

The use of an N-channel type power MOSFET as the switching device will result in a substantial reduction of power loss when the current is flowing forward.

The device to prevent reverse current flow is capable of reducing power loss due to a voltage drop is capable of when a forward current is flowing and of preventing reverse current from flowing when the terminal voltage at the battery exceeds the output voltage. In addition, if connected on the downstream side of the diode to prevent reverse current flow, it can be used generally to prevent overvoltage. It is then possible to substitute low-loss current relay contacts for the switching element which formerly prevented overvoltage and which was a source of power loss. While preventing both reverse current flow and overvoltage, this device also succeeds in reducing total power loss.

The battery in an RV or an electric car is normally fully charged. The device to prevent reverse current flow can be used in place of the diode in the system which supplies power from the power supply to the engine battery. This will minimize the power loss when a forward current is flowing, that is, when the battery is being charged. It will also prevent the battery from discharging when the engine is stopped.

The device to prevent reverse current flow as described above is used in place of a rectifier diode. This reduces the power loss of the entire rectifier circuit.

The device to prevent reverse current flow, which effectively reduces power loss, is applied in a solar generator system. This improves generating efficiency and allows the system as a whole to be reduced in size.

A junction box is used to connect two of the essential components of such a system, the solar inverter and the solar cell. If a number of anti-reverse current devices and circuit breakers are mounted on a single board in this box, fewer assembly processes will be required, and the size of the entire system can be reduced. A solar inverter is another essential component of a solar generator. An anti-reverse current device can be substituted for the inversely connected protective diode in the generator which protects the capacitor and prevents electric shock to the operator. This will fulfill both functions of the diode, that of protecting the capacitor and that of protecting the operator from shock. It will also reduce the power loss as compared to the protective diode and help improve the generating efficiency.

DETAIL DESCRIPTION OF THE INVENTION

We shall next discuss an ideal embodiment of this invention with reference to the drawings.

Figure 1:
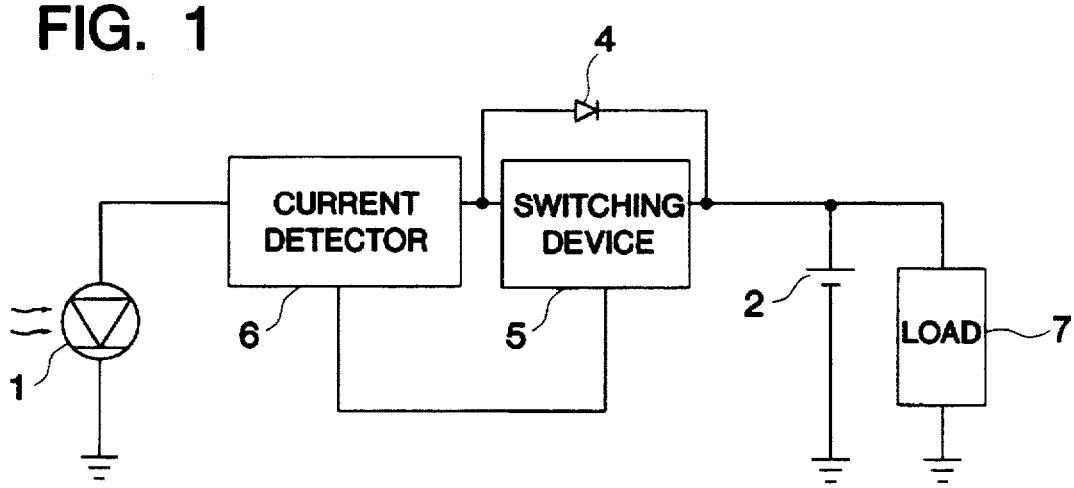
FIG. 1 is a block diagram of the basic configuration used when the device to prevent reverse current flow according to this invention is employed in a solar generator system.

FIG. 1 is a circuit diagram showing the basic configuration of a solar generator system in which a device to prevent reverse current flow according to this invention is implemented. In FIG. 1, a solar cell 1 serves as the power supply; a battery 2 stores and discharges the power generated by the solar cell 1; and a load 7 is connected in parallel to battery 2. Load 7 and battery 2 are connected in series to the solar cell 1 by way of anti-reverse current device 3. The anti-reverse current device 3 consists of an anti-reverse current diode 4, a switching device 5 and a current detector 6. The switching device 5, whose power loss, when on, is smaller than that of diode 4, it is connected to the diode 4 in parallel. The current detector 6, which is connected in series to switching device 5 and diode 4, detects the current generated by the solar cell 1 so as to open or close the aforesaid switching device 5.

We shall next discuss an ideal embodiment of this invention based on the configuration shown in FIG. 1.

First Embodiment

Figure 2:
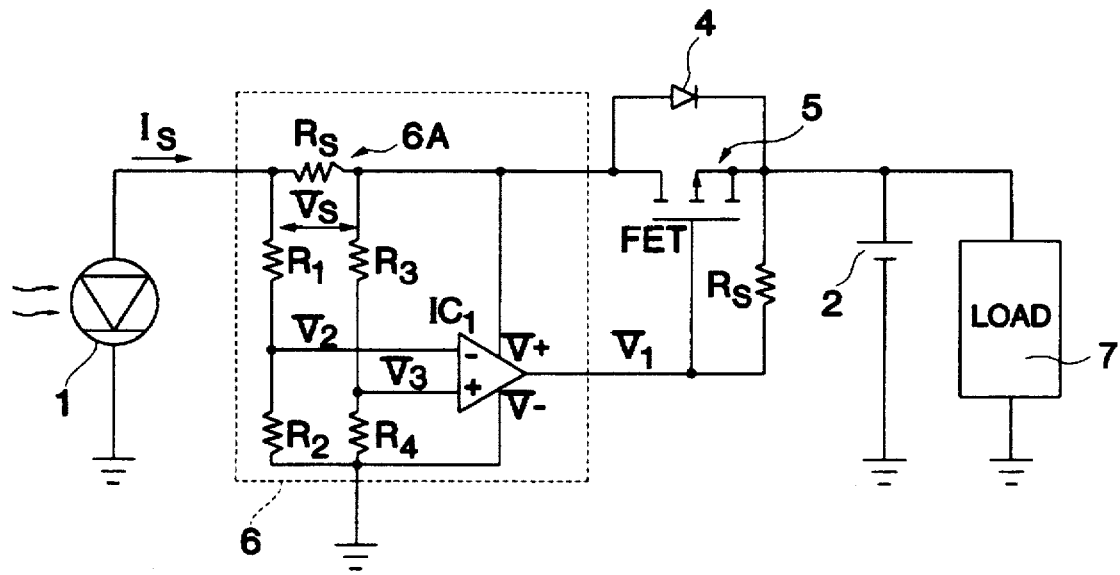
FIG. 2 is a circuit diagram of the first ideal embodiment.
Figure 3:
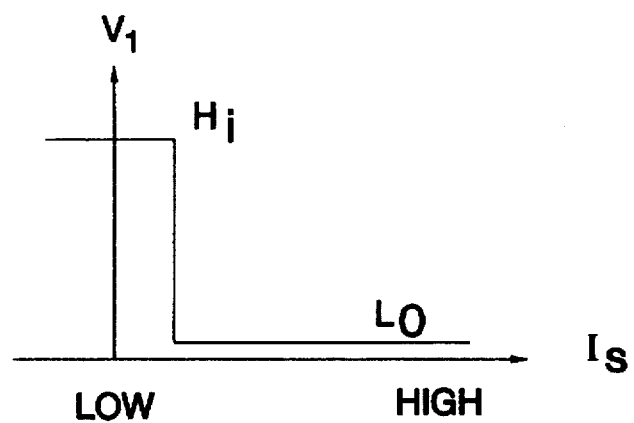
FIG. 3 shows the circuit characteristics of the current detector in the first ideal embodiment.

In FIG. 2 a P-channel power MOSFET is used as switching device 5 in the anti-reverse current device 3. DC current detector 6A, Which consists of input sensing resistor $R_s$, shunt resistors $R_1$ through $R_4$ and comparator $IC_1$, is used as current detector 6. The shunt resistors $R_1$ through $R_4$ are selected so as to give current detector 6 the circuit characteristics shown in FIG. 3.

More specifically, the resistors are selected so that $R_4/(R_3+R_4) > R_2/(R_1+R_2)$. This means that when the current $I_s$ generated by solar cell 1 is small, the output $V_1$ of comparator $IC_1$ will go high ($V_1 \geq V_2$), and when the current $I_s$ generated by solar cell 1 is large, the input resistance voltage $V_s$ will be large, and the output $V_1$ of comparator $IC_1$ will go low ($V_2 > V_3$). The rest of the configuration shown in FIG. 2 is identical to that in FIG. 1. The corresponding components have been labeled with the same numbers and will not be discussed in this section.

We shall next discuss the operation of the device described above.

On a clear day with ample sunlight, a large current $I_s$ will be generated by solar cell 1. The input resistance voltage $V_s$ will be high, and the output $V_1$ of comparator $IC_1$ will go low. Because the output of current detector 6 will be low, the P-channel type MOSFET will remain closed (i.e., on). As a result, generated current $I_s$ will not flow through diode 4, but will bypass it and flow through the low-resistance FET to battery 2 so as to reduce the power loss due to diode 4.

When there is little or no sunlight, as on rainy days or at night, the current $I_s$ generated by solar cell 1 will drop below a given value. The output $V_1$ of comparator $IC_1$ will go high, and the output of current detector 6 will also go high. The P-channel MOSFET will open (i.e., go off), preventing reverse current from flowing from battery 2 to solar cell 1. Because the output of comparator IC1 is open collector type, at night, when output V1 is high, the output current of comparator $IC_1$ will be 0 A. The input sensing resistor Rs and comparator $IC_1$ will be unable to consume the power stored in battery 2.

Second Embodiment

Figure 4:
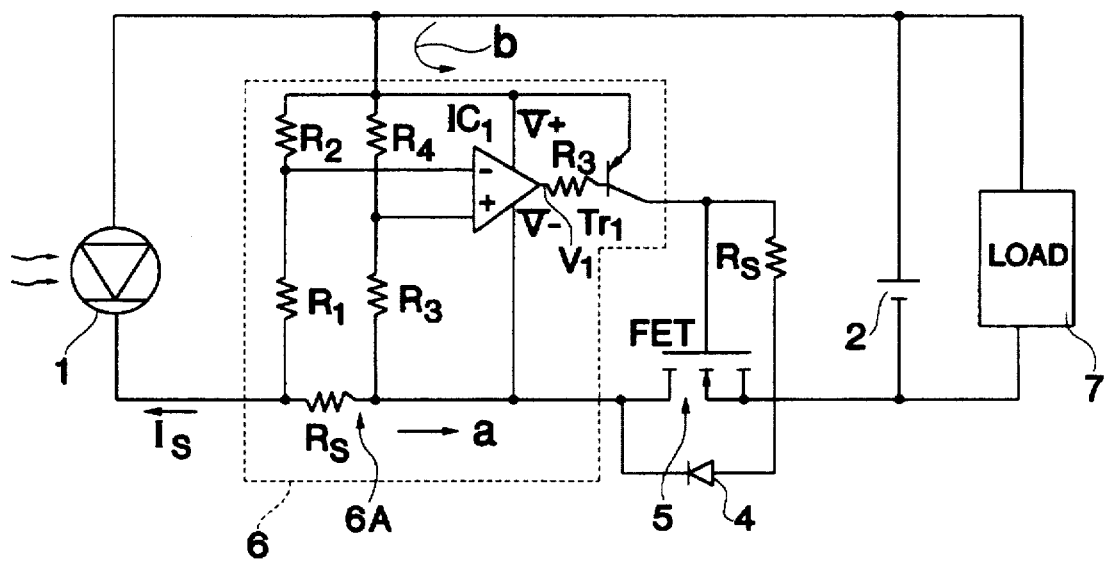
FIG. 4 is a circuit diagram of the second ideal embodiment.

The anti-reverse current devices pictured in FIG. 4 uses an N-channel power MOSFET as switching device 5. Its current detector 6 includes DC current detector 6A, which consists of input sensing resistor Rs, shunt resistors $R_1$ through $R_4$, comparator $IC_1$, and switching transistor $Tr_1$. In place of the positive electrode position in the circuit of the first embodiment, this embodiment has the anti-reverse current devices at the negative electrode.

Figure 5:
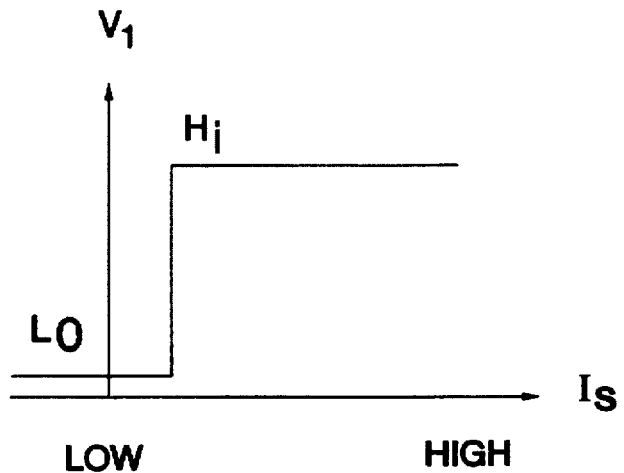
FIG. 5 shows the circuit characteristics of the current detector in the second ideal embodiment.

With the configuration described above, when the current $I_s$ generated by solar cell 1 is large, the input resistance voltage $V_s$ becomes high and the output $V_1$ of comparator $IC_1$ goes high as shown in FIG. 5. The output of current detector 6 will be high, causing the N-channel power MOSFET to remain closed (i.e., on).

When the current $I_s$ generated by solar cell 1 falls below a given value, the output $V_1$ of comparator $IC_1$ will go low and the output of current detector 6 will go low. This will cause the N-channel power MOSFET to open (i.e., to go off), preventing the flow of a reverse current from battery 2 to solar cell 1.

All other aspects of this configuration are identical to that of the first embodiment pictured in FIG. 2. The corresponding components have been labeled with the same numbers and will not be discussed in this section.

The paths indicated by arrows a and b in FIG. 4 are conceivable paths through which battery 2 could discharge at night. Since discharge path a cannot be intercepted by current detector 6, it is blocked by diode 4 while the FET is open. Because discharge path b cannot be intercepted by current detector 6 either, transistor $Tr_1$ goes off. The FET remains open and the current cannot flow. In this way battery 2 is prevented from discharging at night.

If we wish to compare the power loss resulting from the anti-reverse current device 3 in the first and second embodiments discussed above with the power loss which occurs when a forward current flows through diode 4, we can calculate these values using the formulas given below.

(1) Conditions Assumed

Battery Voltage $V_B$: 12 V

Maximum Current Generated $I_{max}$: 3 A $R_1$ through $R_6$: Approx. 100 KΩ

(2) Power Loss $P_d$ of Diode to Prevent Reverse current flow $P_d = I_{max} \times V_{PM}$  ∴ $V_{PM}$: Forward voltage of diode
$= 3A \times 0.55$ V (Fuji Denki ERC80 (5A))
$= 1.65$ W (3) Power Loss $P_1$ of First and Second Embodiments $P_1 = P_2 + P_3 + P_4 + P_5 + P_6$ ∴ $P_2$: Loss from FET
$P_3$: Input Resistance Loss $P_4$: Loss from $IC_1$
$P_5$: Loss for Gate Drive
$P_6$: Resistance Loss from Current Detector In this case, $P_2 = I_{max}^2 \times R_{DS(on)}$ ∴ $R_{DS(on)}$: On resistance between drain and source $= (3A)^2 \times 0.014Ω$ (NCE 2SK1596)
$= 0.126$ W $P_3 = I_{max}^2 \times R_S$  ∴ $R_S$: Resistance value of Input Resistance $= (3A)^2 \times 0.01Ω$
$= 0.09$ W -continued $$P_4 = V_B \times I_{cc} \therefore I_{cc}: \text{Circuit Current}$$
$$= 12 \text{ V} \times 0.006 \text{ A (NEC } \mu\text{PC277)}$$
$$= 0.0072 \text{ W}$$
$$P_5 = \{(V_B)^2/R_5\} + \{(V_B)^2/R_6\}$$
$$= \{(12)^2/100\text{K}\Omega\} + \{(12)^2/100\text{K}\Omega\}$$
$$= 0.0028 \text{ W}$$
$$P_6 = \{(V_B)^2/R_1 + R_2\} + \{(V_B)^2/R_3 + R_4\}$$
$$= \{(12)^2/200\text{K}\Omega\} + \{(12)^2/200\text{K}\Omega\}$$
$$= 0.0014 \text{ W}$$

Accordingly, $$P_1 = 0.26 + 0.09 + 0.0072 + 0.0028 + 0.0014$$
$$= 0.227 \text{ W}$$

When we compare this value with that of (2), we find that $$P_1/P_d = 0.138 = 1/7.3$$

In other words, we have reduced the power loss to one seventh of its former value.

Third Embodiment

Figure 6:
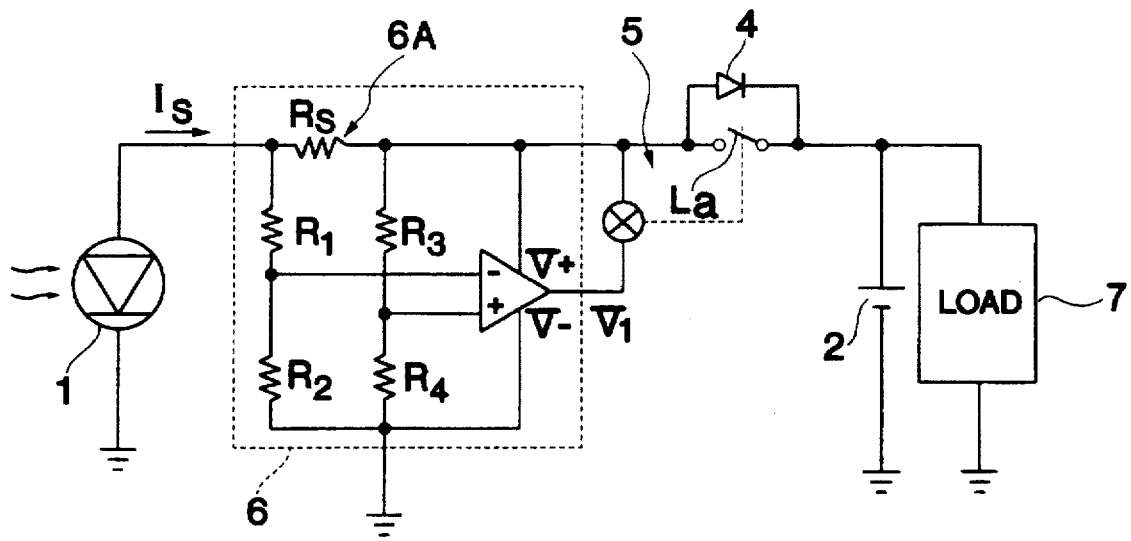
FIG. 6 is a circuit diagram of the third ideal embodiment.

In the anti-reverse current device 3 pictured in FIG. 6, voltage-sensitive relay X is used as switching device 5. Its contacts $L_a$ are connected to diode 4 in parallel. For current detector 6, it features DC current detector 6A, which consists of input sensing resistor $R_r$, shunt resistors $R_1$ through $R_4$ and comparator $IC_1$. Since the resistance values of the shunt resistors $R_1$ to $R_4$ are identical to those of the resistors in the first embodiment and all other aspects of the configuration are identical to that shown in FIG. 1, they have been labeled with the same numbers, and we shall not discuss them further at this point. The fundamental operation of this device is also identical to that of the first embodiment, so we shall omit further explanation.

We can compare the power loss in the anti-reverse current devices of the third embodiment with that experienced when a forward current flows through diode 4 as follows. The hypothetical conditions are identical to those stipulated for the first and second embodiments.

The power loss P7 of the third embodiment can be expressed as $$P_7 = P_8 + P_3 + P_4 + P_6$$

::  $P_8$: Loss from Relay (Omron G5C)
  $P_3$: Input Resistance Loss
  $P_4$: Loss from $IC_1$
  $P_6$: Resistance Loss from Current
Detector
$$= 0.2 + 0.09 + 0.0072 + 0.0014$$
$$= 0.30 \text{ W}$$

If we compare this value with the power loss $P_d$ from the diode used in (2) above, we find that $$P_7/P_d = 0.18 = 1/5.5$$

In other words, the power loss has been reduced to one fifth of its former value.

Fourth Embodiment

Figure 7:
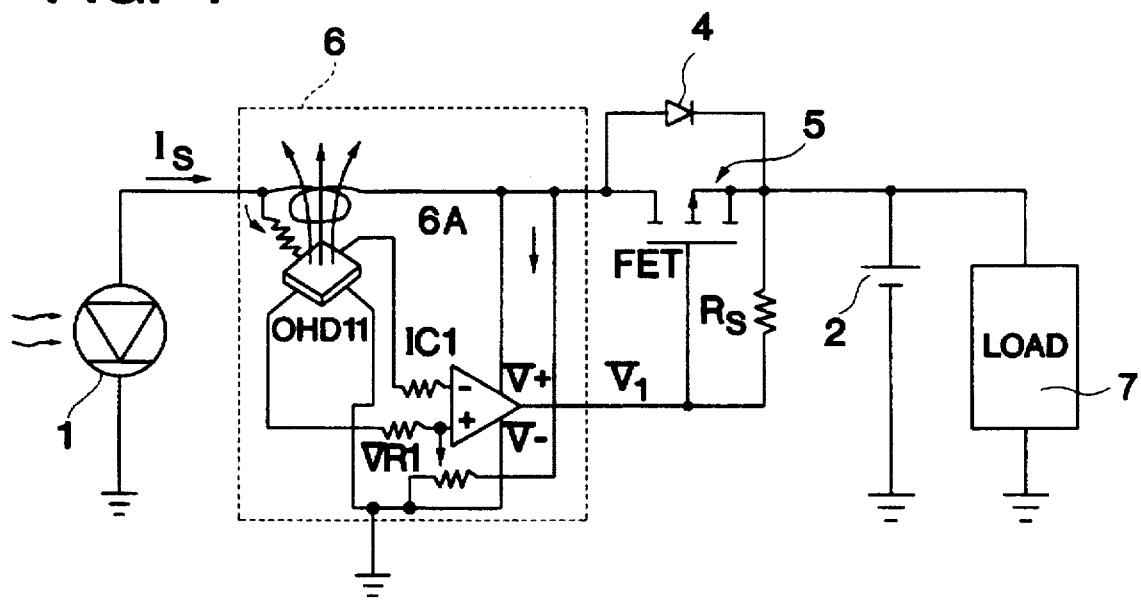
FIG. 7 is a circuit diagram of the fourth ideal embodiment.

The anti-reverse current devices pictured in FIG. 7 uses a P-channel power MOSFET as switching device 5. As current detector 6A, it has a DC current detector 6A consisting of a GaAs Hall element OHD11 (Matsushita Electrical Industries), comparator $IC_1$ and a variable resistor $VR_1$.

Since the rest of its configuration is identical to that in FIG. 1, we have numbered the corresponding components in the same way and will refrain from further discussion here. The basic operation, too, is virtually identical to that of the first embodiment.

If we compare the power loss of the anti-reverse current device 3 in the fourth embodiment with that experienced when a forward current flows through diode 4, we find the following. The hypothetical conditions are:

Battery Voltage $V_B$: 12V

Maximum Generated Current $I_{max}$: 3 A

Current Consumption $I_H$ of Hall Element: 1.7 mA

Value $R_{VR}$ of Variable Resistor: 100 K$\Omega$

The power loss P9 of the fourth embodiment is as follows.

$$P_9 = P_H + P_{VR} + P_2 + P_4 + P_5$$

∵ $P_H$: Loss from Hall Element
  $P_{VR}$: Loss from Variable
Resistor
  $P_2$: Loss from FET
  $P_4$: Loss from IC1
  $P_5$: Loss for Gate Drive
$$= (0.0017 \times 12) + (12^2/100 \cdot 10^3) + 0.126 + 0.0072 + 0.0028$$
$$= 0.158 \text{ W}$$

If we compare this value to the power loss $P_d$ from the diode used in (2) above, we find that $$P_9/P_d = 0.158/1.65 = 1/10.4$$

In other words, the power loss has been reduced to one tenth of its former value.

Fifth Embodiment

Figure 8:
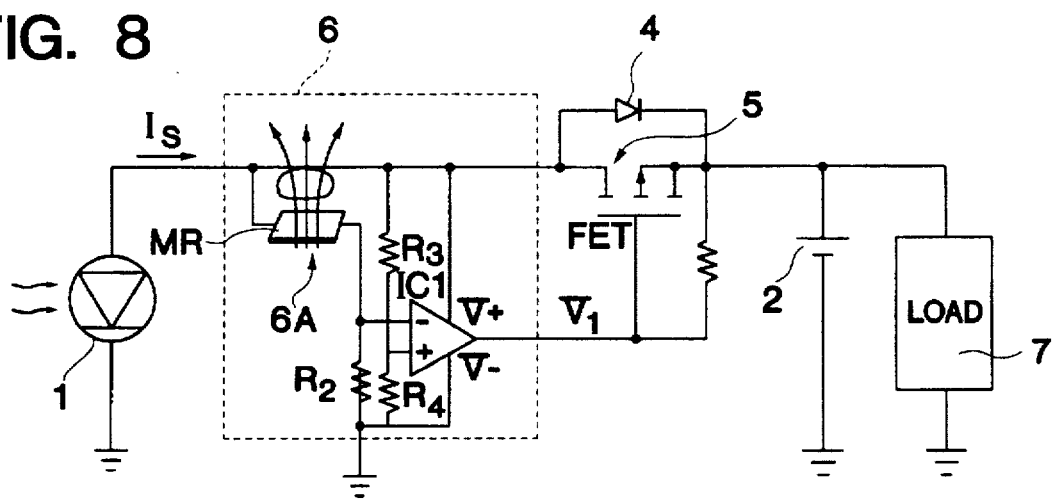
FIG. 8 is a circuit diagram of the fifth ideal embodiment.

In FIG. 8, a P-channel power MOSFET is used as switching device 5 in the anti-reverse current device 3. As current detector 6, this embodiment has DC current detector 6A, which consists of a magnetoresistive (MR) element, shunt resistors $R_2$ through $R_4$, and comparator $IC_1$. Since the rest of the configuration is the same as that in FIG. 1, we have numbered the corresponding components in the same way, and we shall refrain from a further discussion of them. The basic operation of this device, too, is the same as that of the first embodiment.

If we compare the power loss of the anti-reverse current device 3 in the fifth embodiment with that experienced when a forward current flows through diode 4, we find the following. The hypothetical conditions are:

Battery Voltage $V_B$: 12V

Maximum Generated Current $I_{max}$: 3 A

Resistance Value $R_M$ of MR Element: Can be changed as desired by varying the thickness of the membrane or its shape. Here, 100 K$\Omega$ The power loss $P_{10}$ of the fifth embodiment is as follows.

$$P_{10} = P_M + P_2 + P_4 + P_5$$

∵ $P_M$: Loss from MR Element and
  Resistors $R_2$ to $R_4$ ($\approx R_6$)
  $P_2$: Loss from FET
  $P_4$: Loss from $IC_1$
  $P_5$: Loss for Gate Drive
$$= 0.0014 + 0.126 + 0.0072 + 0.0028$$
$$= 0.137 \text{ W}$$

If we compare this value to the power loss $P_d$ from the diode used in (2) above, we find that $$P_{10}/P_d = 0.137/1.65 = 1/12$$

Sixth Embodiment

Figure 9:
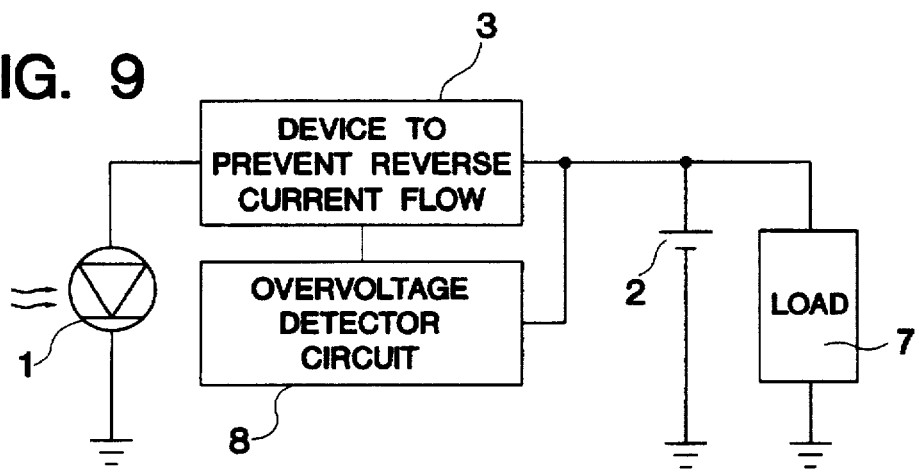
FIG. 9 is a block diagram of the basic configuration of the sixth ideal embodiment.

In FIG. 9, solar cell 1, the power supply, is connected in series by way of anti-reverse current device 3 to battery 2, which stores and discharges the power generated by solar cell 1, and load 7, which is connected in parallel to battery 2. Over voltage detector circuit 8 detects the terminal voltage at battery 2. When the detected voltage exceeds a given value, it prevents overvoltage by cutting off the power supply to the battery 2.

Figure 10:
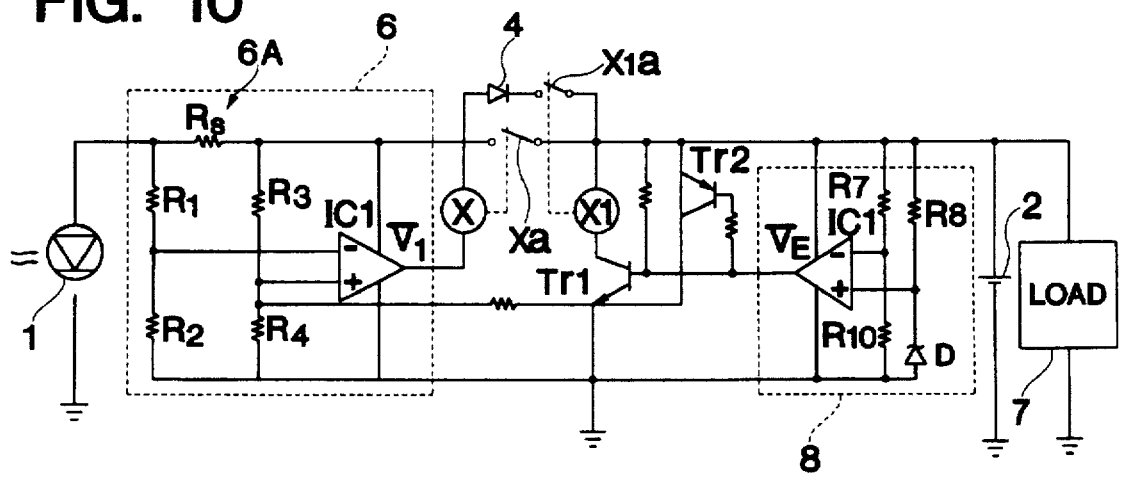
FIG. 10 is a circuit diagram of the device pictured in FIG. 9.

The actual configuration of the circuits is shown in FIG. 10. For switching device 5, which is connected in parallel to diode 4, this design uses a voltage-sensitive relay X which is identical to that in the third embodiment above. Its contacts $X_a$ are connected in parallel to diode 4. For current detector 6, this design features DC current detector 6A, which consists of input sensing resistor $R_s$, shunt resistors $R_1$ through $R_4$ and comparator $IC_1$. These components constitute anti-reverse current device 3. The over voltage detector circuit 8 consists of resistors $R_7$, $R_8$ and $R_{10}$, Zener diode (low-voltage diode) D and comparator $IC_2$. The contacts $X_{1a}$ of voltage-sensitive relay $X_1$, which are opened and closed by the output $V_E$ of circuit 8 through the mediation of transistor $Tr_1$, is connected in series to diode 4. Voltage-sensitive relay X can be opened through the mediation of transistor $Tr_2$ and comparator $IC_2$. Since all other aspects of the configuration are identical to those of the other embodiments, the corresponding components have been labeled with the same numbers, and we shall not discuss them further at this point.

In the sixth embodiment described above, the power loss due to the voltage drop in diode 4 when a forward current is flowing is reduced, and reverse current flow is prevented when the terminal voltage at battery 2 exceeds the output voltage of solar cell 1. In addition, contact sets $X_a$ and $X_{1a}$ of voltage-sensitive relays X and $X_1$ both open when the output $V_E$ of voltage detector circuit 8 goes low so as to automatically prevent overvoltage in battery 2. Generally, a switching element is connected in series on the downstream side of diode 4 to prevent overvoltage. This switching element is a source of power loss. If contacts $X_{1a}$ of low-loss current relay $X_1$ are substituted for this switching element, it can prevent both reverse current flow and overvoltage, as well as reducing the total power loss.

Seventh Embodiment

Figure 11:
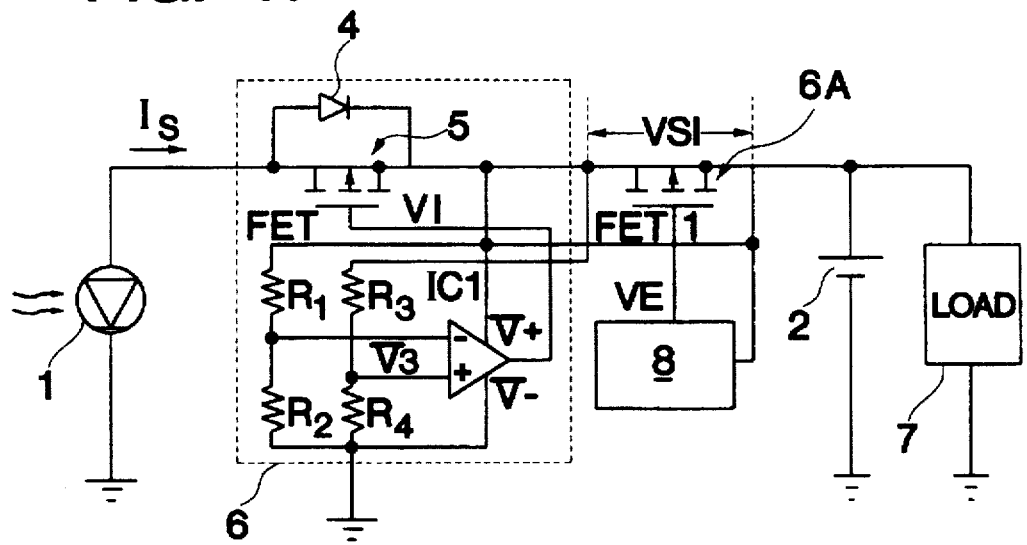
FIG. 11 is a circuit diagram of the seventh ideal embodiment.

In FIG. 11, solar cell 1, the power supply, is connected by way of anti-reverse current device 3 to battery 2, which stores and discharges the power generated by solar cell 1, and load 7, which is connected in parallel to battery 2. Over voltage dector circuit 8 detects the terminal voltage at battery 2. When the detected voltage exceeds a given value, it prevents overvoltage by cutting off the power supply to the battery 2.

The actual configuration of the circuits is as follows. For switching device 5, which is connected in parallel to diode 4, a P-channel power MOSFET is used. Current detector 6 comprises DC current detector 6A, which consists of P-channel power $MOSFET_1$, shunt resistors $R_1$ through $R_4$ and comparator $IC_1$. When the detected terminal voltage exceeds a given value, overvoltage detector circuit 8 causes the $FET_1$ to cut off the power supply to battery 2.

The rest of the configuration is identical to that of the other embodiments discussed previously. Corresponding components have been labeled with the same numbers and will not be discussed further at this point.

With a device configured as described above, the output voltage $V_E$ is low when the terminal voltage detected by circuit 8 is below a given value, and the $FET_1$ remains on. On clear days when there is ample sunlight, the current $I_s$ generated by solar cell 1 will be large. At this time the voltage $V_{s1}$ ($V_a$–$V_b$) at both terminals of the $FET_1$ will be high, the output $V_1$ of comparator $IC_1$ will be low and the output of current detector 6 will be low, causing the FET to remain on. Generated current $I_s$ will not flow through diode 4, but will bypass it and flow instead through the low-resistance FET to battery 2. This will reduce the power loss due to diode 4.

When the current $I_s$ generated by solar cell 1 is below the given value, the voltage $V_{s1}$ at both terminals of the $FET_1$ will be low, the output $V_1$ of comparator $IC_1$ will be high, and the output of current detector 6 will be high. This will cause the FET to go off, preventing the flow of reverse current from battery 2 to solar cell 1.

When the terminal voltage detected by circuit 8 exceeds the given value, its output $V_E$ will go high and the $FET_1$ will remain off, cutting off the power supply to the battery 2 and preventing overvoltage.

Eighth Embodiment

Figure 12:
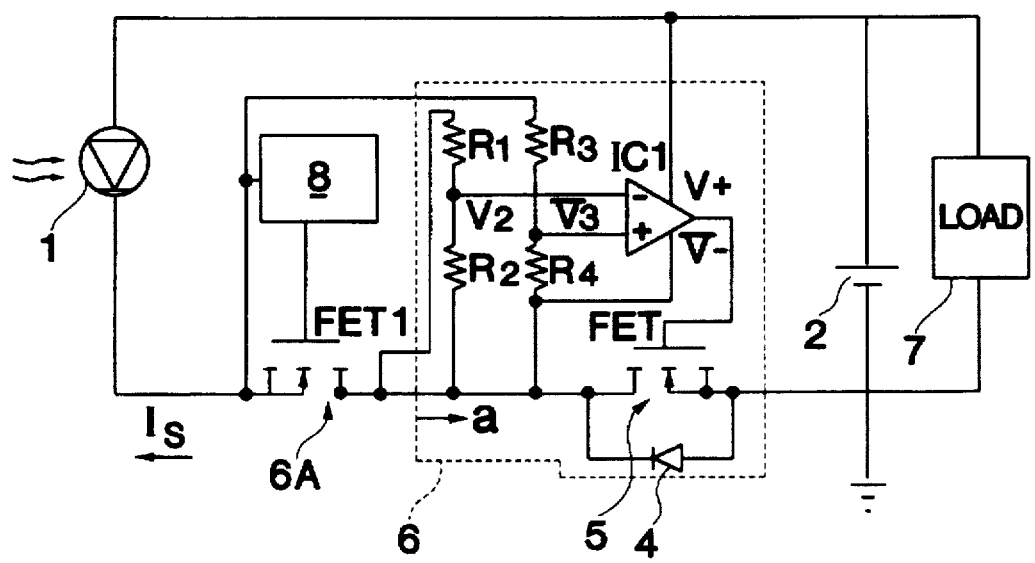
FIG. 12 is a block diagram of the eighth ideal embodiment.

In FIG. 12, an N-channel power MOSFET is used as switching device 5 in the anti-reverse current device 3. For current detector 6, it uses DC current detector 6A, which consists of an N-channel power MOSFET, shunt resistors $R_1$ through $R_4$, and comparator $IC_1$. Here the anti-reverse currents and anti-overvoltage functions are located at the negative electrode, whereas in the seventh embodiment they were placed at the positive electrode.

The rest of the configuration is identical to that of the seventh embodiment as pictured in FIG. 11. Corresponding components have been labeled with the same numbers and will not be discussed further at this point.

Let us compare the power loss occurring in the device 3 in the first and second embodiments discussed above with that occurring in the device 3 in the seventh and eighth embodiments. If the input resistance $R_s$ and the resistance values of the power MOSFET and $FET_1$ are 30 m$\Omega$, the power loss $P_{d1}$ of the first and second embodiments when a current of 3 A is generated will be $$P_{d1} = (3\ A)^2 \times (30\ m\Omega \times 3) = 810\ mW$$

The power loss $P_{d2}$ of the seventh and eighth embodiments does not include input resistance $R_s$.

$$P_{d2} = (3A)^2 \times (30\ m\Omega \times 2) = 540\ mW$$

Power loss $P_{d2}$, then, is only ⅔ of power loss $P_{d1}$.

Figure 13:
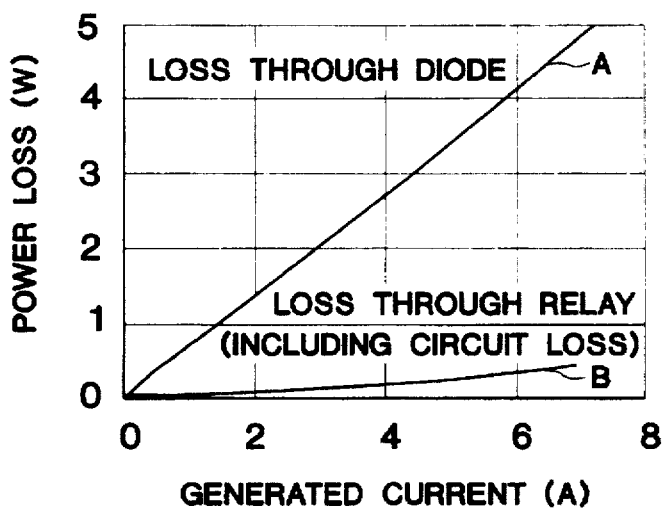
FIG. 13 shows the current vs. power loss characteristic of a device to prevent reverse current flow according to this invention.

FIG. 13 shows the current vs. power loss characteristic. As is clear from the figure, the power loss (characteristic A) of diode 4 at a rated current of 3 A is approximately 2 W. In contrast, the power loss (characteristic B) of relay contacts $X_a$ and $X_{1a}$ shown in FIG. 10 or the power MOSFET and $FET_1$ in FIGS. 11 and 12 is approximately 0.17 W. The loss has been mitigated to less than one tenth of its former value.

Figure 14:
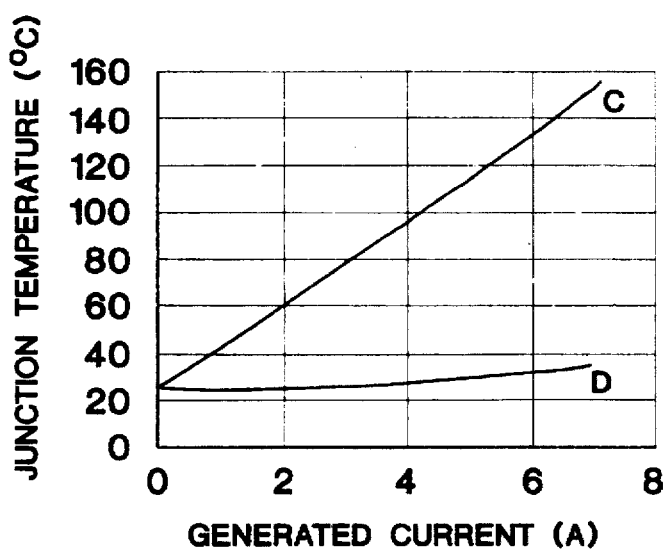
FIG. 14 shows the characteristic for current vs. temperature of element of a device to prevent reverse current flow according to this invention.

FIG. 14 shows the characteristic representing current vs. temperature of element at an ambient temperature of 25° C. As is clear from the figure, the junction temperature of diode 4 is 75° C. at a rated current of 3 A, which is 50° higher than the temperature of the relay. The maximum rated temperature of diode 4 is 150° C. Considering that the temperature inside the case when used outside in summer might reach 50° C., the allowable increase in temperature is 100° C.

If a current of more than 6 A is to flow through diode 4, then, some provision must be made to insure that the heat is radiated. This makes it more difficult to reduce the size of the device. At a junction temperature over 100° C. the failure rate becomes much higher and reliability suffers.

If relay contacts $X_a$ and $X_{1a}$ or a MOSFET and $FET_1$ are used, the junction temperature at a rated current of 3 A will be 2° C. higher (approximately 1/25 the increase of diode 4). At a rated current of 7 A, the junction temperature will be 15° C. higher (1/5 the increase of diode 4). It is not necessary to design a means to radiate the excess heat, the device can be made smaller, and its reliability will be enhanced.

Ninth Embodiment

In each of the embodiments discussed above the parasitic diode of a power MOSFET can be used for the diode 4. This will allow the anti-reverse current device 3 to be miniaturized.

Tenth Embodiment

Figure 15:
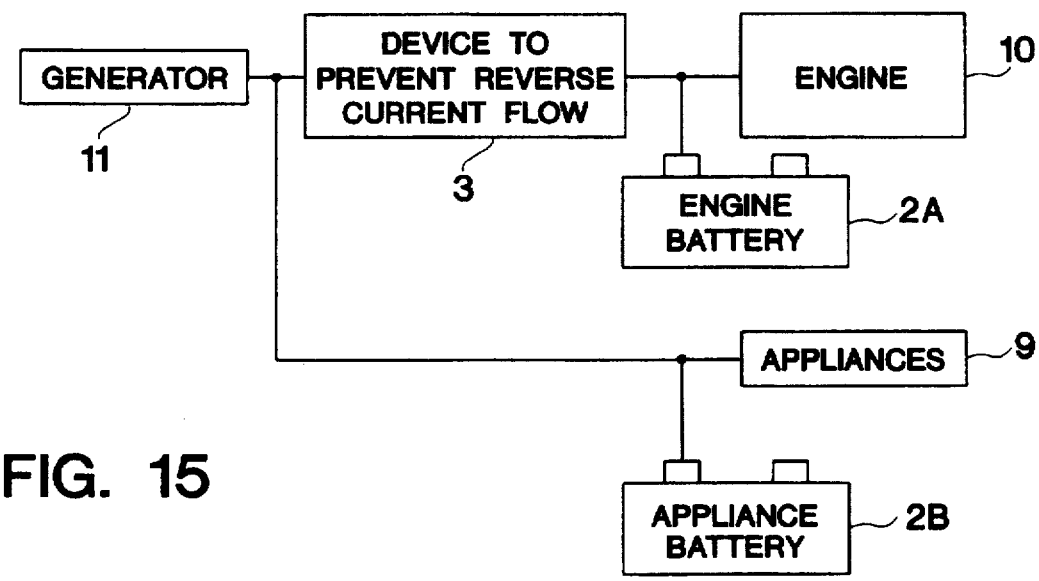
FIG. 15 is a block diagram of the configuration of the tenth ideal embodiment.

This embodiment is pictured in FIG. 15. An RV or electric car has a battery 2A, which supplies power from generator 11 (the power supply) to drive engine 10 and a battery 2B, which supplies power to electrical devices 9 in the automobile. The battery 2A is normally charged. An anti-reverse current device 3 as described above can be substituted for the diode 4 in the power supply system between generator 11 and battery 2A. With this embodiment, the power loss which occurs when current is flowing forward from generator 11, i.e., when the battery is charging, is substantially reduced battery 2A is prevented from discharging when engine 10 is stopped. Furthermore, the radiator panel can be reduced in size or eliminated.

Eleventh Embodiment

Figure 16:
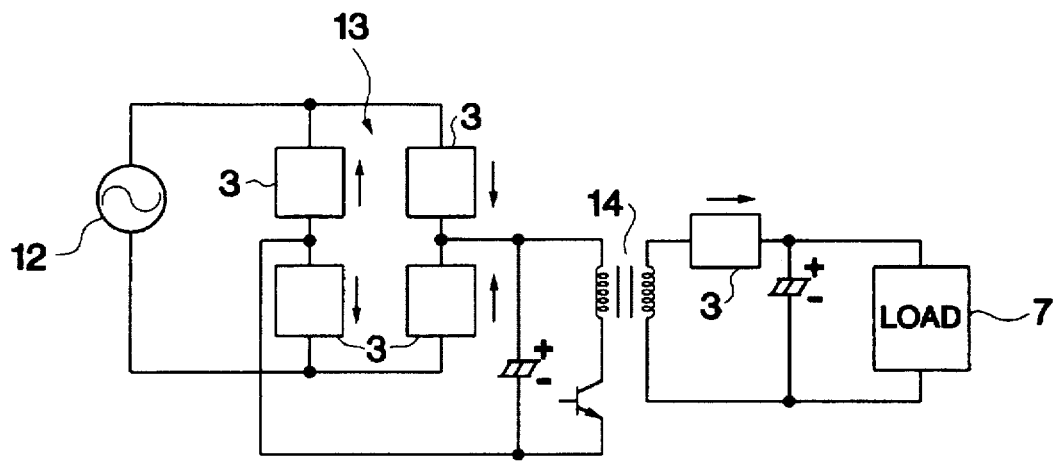
FIG. 16 is a block diagram of the configuration of the eleventh ideal embodiment.

In this embodiment, which is pictured in FIG. 16, four rectifier diodes are grouped in the shape of a diamond to convert the alternating current input by AC power supply 12 to direct current. When AC voltage is applied to one pair of opposite sides of the diamond, a direct current will be obtained from the other, i.e., the diagonally opposite, pair. This configuration constitutes bridge-type full wave rectifier 13. For each rectifier diode in rectifier 13, an anti-reverse current device 3 can be substituted above. The anti-reverse current device 3 can also be substituted for the DC smoothing diode connected through transformer 14 to the output side of the full wave rectifier 13. With this configuration, the power loss through the rectifier and smoothing diodes will be reduced and the efficiency of rectification will improve.

Twelfth Embodiment

Figure 17:
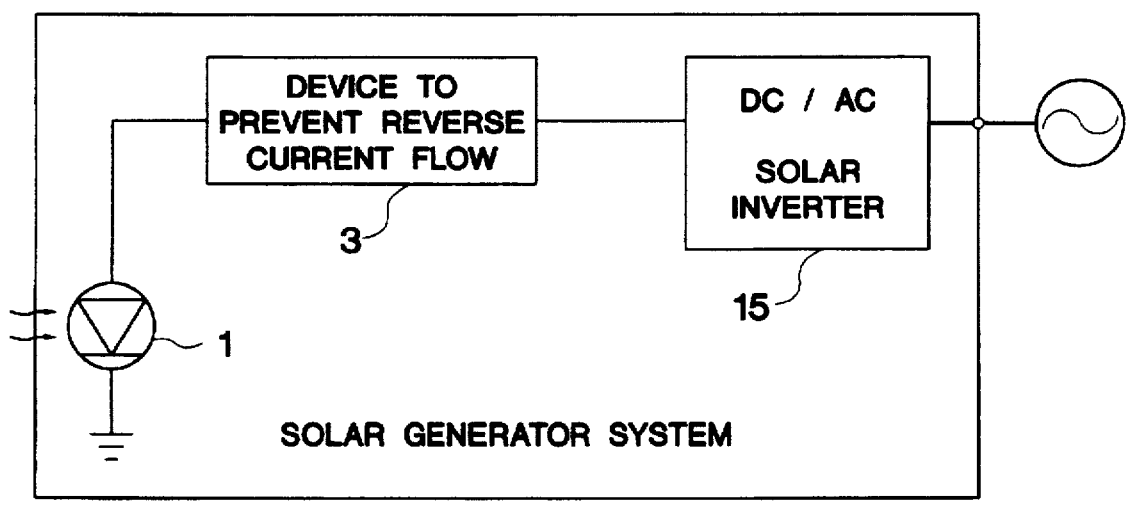
FIG. 17 is a block diagram of the configuration of the twelfth ideal embodiment.

This embodiment is pictured in FIG. 17. Here the invention is applied in a solar generator system, where an anti-reverse current device 3 as described above is placed between solar cell 1 and DC/AC solar inverter 15. With this embodiment, the power loss while power is being generated is reduced, with the result that the generating efficiency is enhanced. The overall system can be made smaller, and the flow of reverse current at times when there is little sunlight can be securely prevented.

Figure 18:
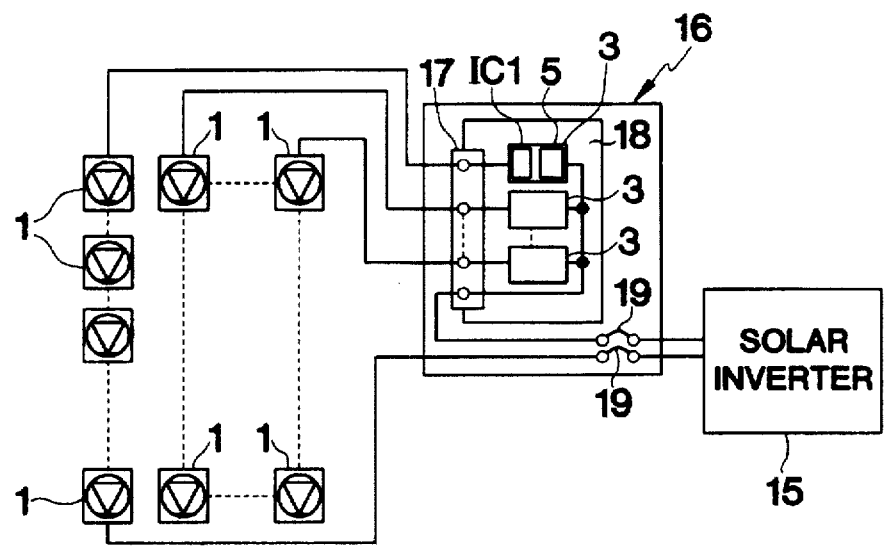
FIG. 18 is a block diagram of a device in which the twelfth ideal embodiment of this invention is employed.
Figure 19:
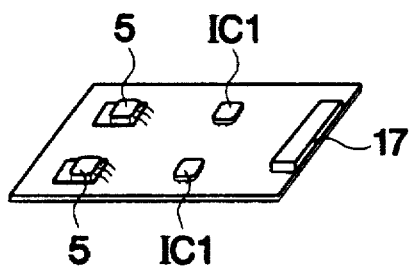
FIG. 19 is a perspective drawing of one of the essential elements in FIG. 18.

In the twelfth embodiment, as shown in FIG. 18, solar inverter 15, a structural element of this solar generator system, can be connected to solar cells 1, which are arranged in rows on the roof, through junction box 16, which could be placed, for example, in the space under the eaves. In this junction box, a single board 18 with a terminal block or connector 17 could have a number of anti-reverse current devices 3 and circuit breakers 19 mounted on it. This junction box requires fewer production processes and can be made smaller and more space-efficient.

Figure 20:
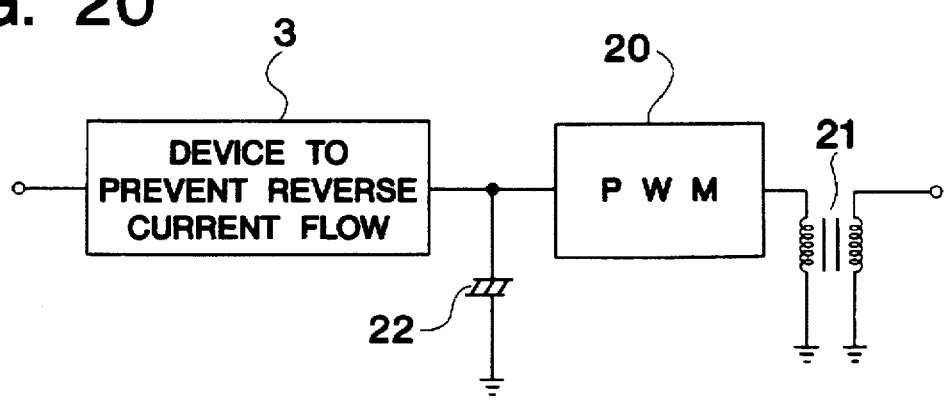
FIG. 20 is a block diagram of the solar inverter which is one of the components in which this invention is employed in the twelfth ideal embodiment.
Figure 21:
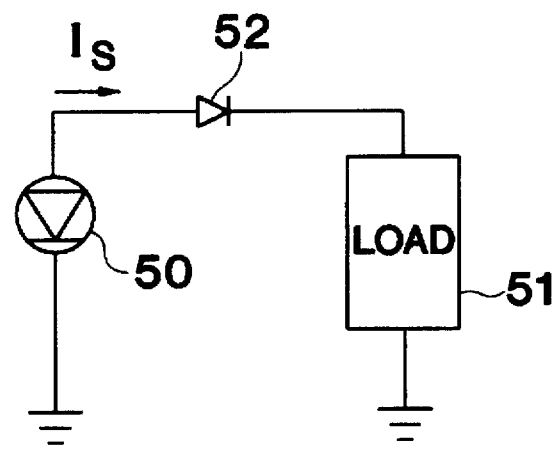
FIG. 21 is a block diagram of a common type of solar generator system.
Figure 22:
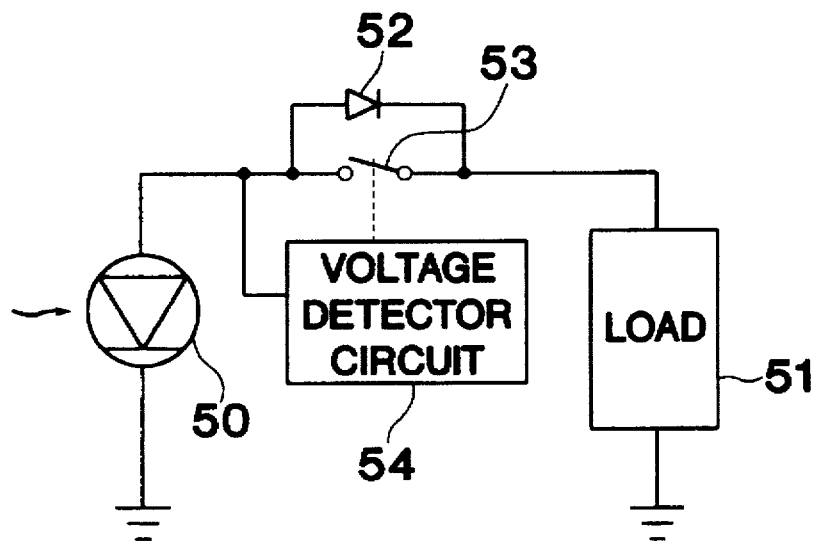
FIG. 22 is a block diagram of a solar generator system available in the prior art.

Solar inverter 15, an essential element of the solar generator system is pictured in FIG. 20. PWM 20 and transformer 21 are connected to capacitor 22 in series. An anti-reverse current device 3 as described above could be used in place of the protective diode which, by being connected in reverse, protects capacitor 22 and prevents shock to the operator. In addition to protecting the capacitor and the operator, as discussed above, the use of an anti-reverse current device would reduce the power loss due to the protective diode and improve the generating efficiency.

When current is flowing forward from a power supply to a load, it flows through a switching device whose power loss is lower than that of the diode which prevents the flow of reverse current. This switching device might be a power MOSFET or the contacts of a voltage-sensitive relay. This scheme substantially reduces the power loss due to voltage drop which would have been incurred by the diode. When the forward current is small or when the load is a battery and the terminal voltage at the battery is higher than the output voltage of the power supply, the switching device is opened in response to a signal from a low-loss current detector such as a shunt resistor, a Hall element or a magnetoresistive element. Reverse current is prevented from flowing by the diode. Also, the resistance loss from the aforesaid current detector is extremely small, and the power loss when the terminal voltage at the battery exceeds the output voltage of the aforesaid power supply is also quite small. These results are also effects of this invention.

If an N-channel power MOSFET is used as the switching element, the power loss when a forward current is flowing will be reduced even further.

The power loss due to voltage drop when a forward current is flowing is reduced and a reverse current is prevented from flowing when the terminal voltage at the battery exceeds the output voltage of the power supply. In addition, a low-loss current relay contact set can be used as the switching element to prevent overvoltage, which is also a source of power loss. This scheme prevents both reverse current flow and overvoltage and substantially reduces the total power loss.

The power loss when a forward current is flowing, that is, when the engine battery is charging, is very small. When the engine is stopped, the battery is prevented from discharging. Thus an engine battery in an RV or an electric car will normally be kept fully charged.

The power loss incurred by the rectifier diode during rectification is reduced and the efficiency of rectification is improved.

The anti-reverse current devices, which effectively reduces power loss, is employed in a solar generator system. This improves the generating efficiency and allows the entire system to be downsized. If the solar inverter, which is an essential element of the solar generator system, is connected to the solar cells through a junction box in which a number of anti-reverse current devices and circuit breakers are mounted on a single board, fewer assembly processes will be required and a smaller junction box will result. If an anti-reverse current device as described above were used in the solar inverter in place of the protective diode which, by being connected in reverse, protects the capacitor and prevents shock to the operator, both the capacitor and the operator would be protected, the power loss would be reduced, and the generating efficiency would improve.

What is claimed is:

1. A device to prevent reverse current flow in a circuit, comprising:
    a diode connected between a power supply and a load in said circuit;
    a switching device connected in parallel with the diode, said switching device having a power loss smaller than that of said diode;
    a low-loss current detector connected in said circuit to turn the switching device on and off, said low-loss current detector comprising:
        a DC current detector to detect a value of a DC current in said circuit; and
        a comparator which compares the detected DC current value with a threshold value for an operating current and generates an output signal that determines when the switching device is turned on and off.

2. A device to prevent reverse current flow according to claim 1, wherein the switching device comprises a power MOSFET.

3. A device to prevent reverse current flow according to claim 1, wherein the diode comprises a parasitic diode of a power MOSFET.

4. A device to prevent reverse current flow according to claim 1, wherein the switching diode comprises a voltage-sensitive relay having contacts connected in parallel to said diode.

5. A device to prevent reverse current flow according to claim 2, wherein the power MOSFET comprises a P-channel type.

6. A device to prevent reverse current flow according to claim 2, wherein the power MOSFET comprises a N-channel type.

7. A device to prevent reverse current flow according to claim 1, wherein the DC current detector comprises an input sensing resistor.

8. A device to prevent reverse current flow according to claim 1, wherein the DC current detector comprises a Hall element.

9. A device to prevent reverse current flow according to claim 1, wherein the DC current detector comprises a magnetoresistive element.

10. A device to prevent reverse current flow according to claim 1, wherein the DC current detector detects a voltage across both terminals of an element passing a forward current.

11. A device to prevent reverse current flow according to claim 1, wherein the DC current detector detects a voltage across both terminals of a switching element, and wherein the switching element operates in response to an output signal of an overvoltage detector circuit.

12. A device to prevent reverse current flow connected between a power supply and a battery which can store and discharge a power generated by said power supply, said device comprising:
    a diode; a switching device having a power loss smaller than said diode is connected in parallel to the diode;
    a low-loss current detector, arranged to turn said switching device on and off, connected in series to the diode and the switching device; and
    a relay contact configured to cut off the supply of power to the battery when a voltage at the battery exceeds a given value, wherein the relay contact is connected in parallel to the diode and in series to the switching device.

13. A device to prevent reverse current flow according to claim 1, wherein the load is an engine battery.

14. A rectifier connected between a power supply and a load device in a circuit and having a device to prevent reverse current flow in said circuit, said device comprising:
    a diode connected between the power supply and the load in said circuit;
    a switching device connected in parallel with the diode, said switching device, when on, having a power loss smaller than that of the diode;
    a low-loss current detector connected in said circuit to turn the switching device on and off, said low-loss current detector comprising:
        a DC current detector to detect a value of a DC current in said circuit; and
        a comparator which compares the detected DC current value with a threshold value for an operating current and generates an output signal that determines when the switching device is turned on and off.

15. A solar generating system having a device to prevent reverse current flow in a circuit between a solar cell and a solar inverter, said device comprising:
    a diode connected between the solar cell and the solar inverter in said circuit;
    a switching device connected in parallel with the diode having a power loss smaller than that of said diode;
    a low-loss current detector connected in said circuit to turn the switching device on and off, said low-loss current detector comprising:
        a DC current detector to detect a value of a DC current in said circuit; and
        a comparator which compares the detected DC current value with a threshold value for an operating current and generates an output signal that determines when the switching device is turned on and off.

16. A solar generator system according to claim 15, further comprising a plurality of said devices to prevent reverse current flow mounted on a single board, wherein the board is adjacent with a circuit breaker.

17. A solar generator system according to claim 15, wherein the device to prevent reverse current flow is substituted for a protective diode in the solar inverter.

* * * * *